(12) United States Patent
Saeidi et al.

(10) Patent No.: US 10,283,106 B1
(45) Date of Patent: May 7, 2019

(54) NOISE SUPPRESSION (71) Applicant: Cirrus Logic International Semiconductor Ltd., Edinburgh (GB)

(72) Inventors: Rahim Saeidi, Guildford (GB); Pablo Peso Parada, Kingsquarter (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/938,614

(22) Filed: Mar. 28, 2018

(51) Int. Cl.
*H03H 17/02* (2006.01)
*G10K 11/178* (2006.01)

(52) U.S. Cl.
CPC .. *G10K 11/17853* (2018.01); *G10K 11/17823* (2018.01); *H03H 17/0219* (2013.01); *G10K 2210/1053* (2013.01); *G10K 2210/1081* (2013.01); *G10K 2210/3011* (2013.01); *G10K 2210/3026* (2013.01); *G10K 2210/3028* (2013.01)

(58) Field of Classification Search
CPC ........... G10K 11/178; G10K 11/17881; G10K 11/17854; G10K 11/17875; G10K 11/17823; G10K 11/17879; G10K 2210/1053; G10K 2210/3011; G10K 2210/3026; G10K 2210/3028; H03H 17/0219
See application file for complete search history.

(56) References Cited

U.S. PATENT DOCUMENTS

| | | | | |
|---|---|---|---|---|
| 2010/0002891 | A1* | 1/2010 | Shiraishi | H04R 3/02 381/71.8 |
| 2011/0158427 | A1 | 6/2011 | Chiba et al. | |
| 2011/0299695 | A1* | 12/2011 | Nicholson | G10K 11/17833 381/71.6 |
| 2013/0170660 | A1* | 7/2013 | Kristensen | H04R 25/305 381/60 |

FOREIGN PATENT DOCUMENTS

| | | |
|---|---|---|
| EP | 1825712 A1 | 6/2006 |
| EP | 2148525 A1 | 1/2010 |
| EP | 2613567 A1 | 7/2013 |

OTHER PUBLICATIONS

Combined Search and Examination Report under Sections 17 and 18(3), UKIPO, Application No. GB1809360.9, dated Nov. 30, 2018.

* cited by examiner

*Primary Examiner* — Yogeshkumar Patel
(74) *Attorney, Agent, or Firm* — Jackson Walker L.L.P.

(57) ABSTRACT

The present application describes techniques for noise control which utilize a feedback control unit comprising a filter, derived from one or more predetermined filter candidates, for reducing or cancelling a feedback component of a noise control signal.

15 Claims, 7 Drawing Sheets

NOISE SUPPRESSION

TECHNICAL FIELD

Embodiments described herein relate to techniques for active noise cancellation. In particular, embodiments described herein relate to techniques for suppressing an acoustic feedback signal.

BACKGROUND

Many devices include loudspeakers, which are used to play sounds to a user of the device, based on an input signal. For example, the input signal may be derived from a signal that has been received by the device over a communications link, in the case of a phone call or the like, or may be derived from stored data, in the case of music or speech playback.

As wireless communication devices, Mp3 players and other devices for audio playback move even further into everyday use, features like noise cancellation become more important to help ensure higher-quality audio playback and phone calls.

Noise cancellation embraces a number of different approaches to eliminating unwanted noise in order to enhance the listening experience of a user. Active noise cancellation or control (ANC) refers to a method of reducing noise by the addition of an anti-noise—a phase inverted noise signal—which destructively interferes with the noise. This is generally achieved by using a reference microphone to sense environmental or ambient noise and by deriving an anti-noise signal that is emitted by a speaker in order to cancel or at least control the noise. As will be appreciated by those skilled in the art that active noise control can be achieved with analog filters or digital filters, and is generally differentiated by architecture: feed-forward cancellation, feedback cancellation or hybrid cancellation.

Figure 1:
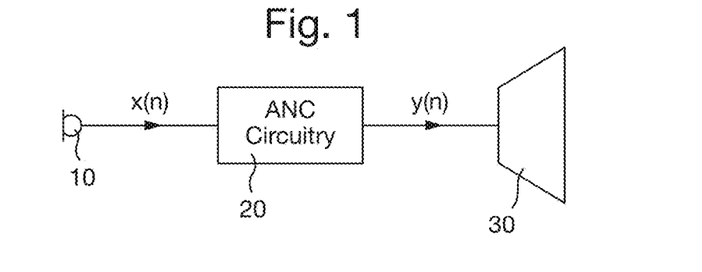
FIG. 1 provides a simplified illustration of a feedforward ANC system.

FIG. 1 provides a simplified illustration of a feedforward ANC system. As illustrated in FIG. 1 a reference microphone 10 detects incident ambient sounds—or noise—and generates an input signal x(n) for an ANC circuit 20. The ANC circuit 20 processes the signal in order to derive a control signal y(n) which is passed to the loudspeaker transducer 30 and is emitted by the loudspeaker 30 as anti-noise. Thus, the ANC circuit may be considered to comprise a control filter having a transfer function $H_{nc}$ which inversely models the noise signal for generating the required control sound signal. An error microphone (not shown) is typically provided to measure the error between the noise signal and the anti-noise signal in order that the transfer function $H_{nc}$ of the ANC circuit may be adapted.

Figure 2:
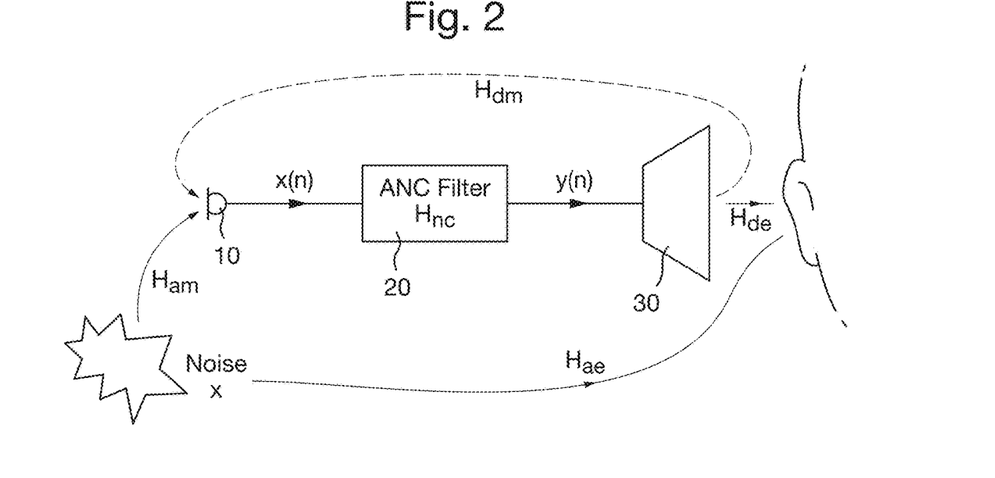
FIG. 2 provides a further illustration of a feedforward ANC system.

As illustrated in FIG. 2, it will be appreciated that the anti-noise signal will not only propagate towards a user's ear $H_{de}$ (where d denotes the driver and e denotes the ear), but may also propagate on a leakage path, or feedback path $H_{dm}$ (where d denotes the driver/loudspeaker and m denotes the microphone), towards the reference microphone. This is known as acoustic feedback and results in a corrupted reference signal x(n). Thus, the reference signal will additionally contain the acoustic feedback signal that is sensed by the reference microphone. When an acoustic control system has a feedback path the leakage often causes unstable behaviour called howling.

The stability of the control system will be significantly influenced by the feedback signal and will depend on the transfer characteristics of an acoustic feedback path $H_{dm}$ between the speaker and the reference microphone. The problem of acoustic feedback is particularly an issue in the case of a mobile communication device, such as a mobile phone, due to the close proximity between the reference microphone and the speaker.

Feedback control techniques have been proposed which seek to cancel or at least reduce the presence of a feedback signal comprised in an input signal generated by a reference microphone. This is achieved by designing a filter which is designed to inversely model the transfer function of the feedback path. Thus, the feedback filter can be used to reduce or cancel the feedback signal.

However, it will be appreciated that the characteristics, or transfer function, of the feedback path will change during normal usage of the device. Specifically, the characteristics of the feedback path between a speaker and the reference microphone of an ANC system can vary between different users of a device, which implements the ANC system, and also between different instances of use of the device by the same user. The leakage path may vary due to a variety of different user-specific parameters which influence the characteristics of leakage such as device positioning in use, hair style, the presence of glasses and the shape of a user's ears. Furthermore, the feedback characteristics will also depend on the acoustic and/or mechanical and/or material properties of the device itself.

It will be appreciated that this variation in acoustic leakage has consequences for the effectiveness of a feedback control filter which is intended to reduce or cancel the feedback signal. Furthermore, the variation in acoustic feedback impacts the effectiveness of an active noise cancellation process. Adaptive feedback control filters have been proposed which utilise adaptive LMS algorithms in order to model the feedback path. However, such methods are complex for real-time implementation and require a great amount of tuning.

Examples described herein are generally directed to alleviating the issue of acoustic feedback between a speaker and reference microphone of a device comprising an ANC system. In particular, examples described herein seek to provide techniques for feedback control which accommodate a variation in the characteristics of the feedback path.

According to an example of a first aspect there is provided a noise control circuit comprising:
a noise control unit arranged to receive an input signal generated by a reference microphone, the noise control unit being configured to generate a noise control signal based on the input signal, wherein the noise control signal is passed to a speaker;
a feedback control unit comprising a filter, the feedback control unit being configured to receive the noise control signal and to pass the noise control signal through the filter in order to generate a feedback control signal for controlling a feedback signal comprised in the input signal,
wherein the filter is derived from one or more predetermined filter candidates, each filter candidate representing a possible feedback path between the speaker and the reference microphone.

The feedback control signal may be subtracted from the input signal in a stage prior to the input signal being passed to the noise control unit.

The noise control circuit may further comprise a filter selection unit configured to derive (i.e. select or build) said filter from said dictionary of predetermined filter candidates. Optionally, the filter selection unit is operable to derive said filter candidate based on, for each filter candidate, a determination of an error that will arise if that filter candidate is selected to generate the feedback control signal. Optionally, the filter selection unit is configured to receive the noise control signal and to pass the noise control signal through each of the candidate filters to generate a set of candidate feedback control signals. Further, the filter selection unit may be configured to receive the input signal and to determine a difference between the input signal and each of the candidate feedback control signals in order to calculate the error for each filter candidate. The filter candidate that is selected to be the filter for the feedback control unit may be the filter candidate for which the lowest error (or a highest similarity score) is determined. According to one example the filter for the feedback control unit is derived from a weighted combination of a plurality of the filter candidates.

According to one or more example the speaker generates an anti-noise signal based on the noise control signal in order to cancel or at least reduce the noise that is heard by a user.

The feedback control unit may be provided in parallel with the feedback path between the speaker and the reference microphone. The feedback control signal may be considered to comprises an estimation of the feedback signal.

According to an example of a second aspect there is provided a method of noise control comprising:
generating a noise control signal based on an input signal received from a reference microphone, wherein the noise control signal is passed to a speaker;
deriving a filter from a plurality of predetermined filter candidates, wherein each filter candidate represents a feedback path between the speaker and the reference microphone;
generating a feedback control signal for controlling a feedback signal comprised in the input signal, wherein the feedback control signal is generated by passing the noise control signal through the selected filter to obtain the feedback control signal.

The method may further comprise subtracting the feedback control signal from the input signal prior to generating the noise control signal.

The step of selecting the filter from the plurality of filter candidates may comprise, for each filter candidate, determining an error that will arise if that filter candidate is selected to generate the feedback control signal.

According to at least one example, the method may further comprise:
receiving, at the filter selection unit, the noise control signal; and
passing the noise control signal through each of the candidate filters to generate a set of candidate feedback control signals.

According to at least one example, the method may further comprise:
receiving, at the filter selection unit, the input signal; and
determining a difference between the input signal and each of the candidate feedback control signals in order to calculate the error (or similarity) for each filter candidate. The method may further comprise selecting the filter candidate for which the lowest error is determined to be the filter for the feedback control unit.

According to a further aspect of the present invention there is provided a method of characterising a device having a noise control circuit, the method comprising:
i) providing the device in a first position and measuring a first impulse response of a feedback path between a speaker and a reference microphone of the noise control circuit;
ii) generating a first filter candidate from the first impulse response;
iii) storing the first filter candidate;
iv) repeating steps i) to iii) to obtain M filter candidates, wherein M is the number of different paths from speaker to the reference microphone realized for example by positions of the device.

According to one or more examples the noise control circuit may be provided in the form of a single integrated circuit.

According to a further aspect there is provided a device comprising the noise control circuit according to an example of the first aspect. The device may comprise, inter alia, a mobile telephone, headphone, acoustic noise cancelling headphones, a smart watch, an audio player, a video player, a mobile computing platform, a games device, a remote controller device, a toy, a machine, or a home automation controller, a domestic appliance or other portable device.

According to a further aspect there is provided a feedback control module having a filter for controlling a feedback signal comprised in a noise control signal, wherein the filter models the feedback path based on a weighted sum of candidate feedback paths. The filter, which can be considered to be a fixed filter which is built at run time from a library of predetermined filter candidates. The feedback control module may be configured to receive, as an input, a noise control signal generated by a noise control module.

Any of the features of the above examples of any of the above aspects may be provided in combination with the features of any examples of any of the other aspects.

According to another aspect of the present invention, there is provided a computer program product, comprising a computer-readable tangible medium, and instructions for performing a method according to at least one example of the previous aspects.

According to another aspect of the present invention, there is provided a non-transitory computer readable storage medium having computer-executable instructions stored thereon that, when executed by processor circuitry, cause the processor circuitry to perform a method according to the previous aspect.

BRIEF DESCRIPTION OF DRAWINGS

For a better understanding of the present invention and to show how the same may be carried into effect, reference will now be made by way of example to the accompanying drawings in which.

DETAILED DESCRIPTION

The description below sets forth examples according to the present disclosure. Further example embodiments and implementations will be apparent to those having ordinary skill in the art. Further, those having ordinary skill in the art will recognize that various equivalent techniques may be applied in lieu of, or in conjunction with, the examples discussed below, and all such equivalents should be deemed as being encompassed by the present disclosure.

The methods described herein can be implemented in a wide range of devices and systems. However, for ease of explanation of one example, an illustrative example will be described, in which the implementation occurs in a mobile communication device such as a mobile phone.

Figure 3:
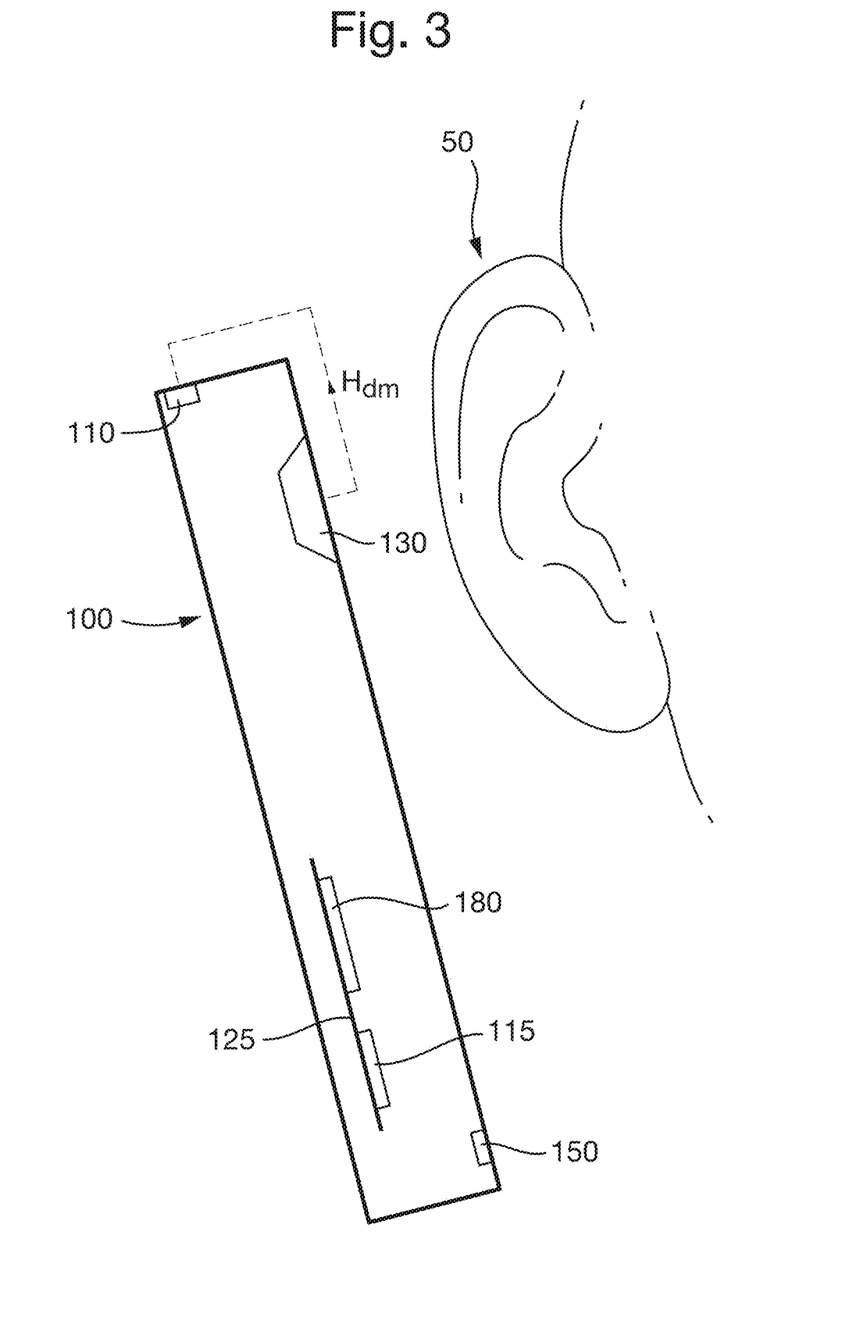
FIG. 3 illustrates a wireless communication device implementing a noise control circuit in accordance with a first example.

FIG. 3 illustrates a wireless communication device 100 implementing a noise control circuit in accordance with a first example of the present aspects. The wireless communication device 100 is shown in proximity with a user's ear 50.

The wireless communication device comprises a transducer, such as a speaker 130, which is configured to reproduce distance sounds, such as speech, received by the wireless communication device along with other local audio events such as ringtones, stored audio program material, and other audio effects including a noise control signal. A reference microphone 110 is provided for sensing ambient acoustic events. The wireless communication device further comprises comprises a near-speech microphone which is provided in proximity to a user's mouth to sense sounds, such as speech, generated by the user.

A circuit 125 within the wireless communication device comprises an audio CODEC integrated circuit (IC) 180 that receives the signals from the reference microphone, the near-speech microphone 150 and interfaces with the speaker and other integrated circuits such as a radio frequency (RF) integrated circuit 12 having a wireless telephone transceiver.

Figure 4:
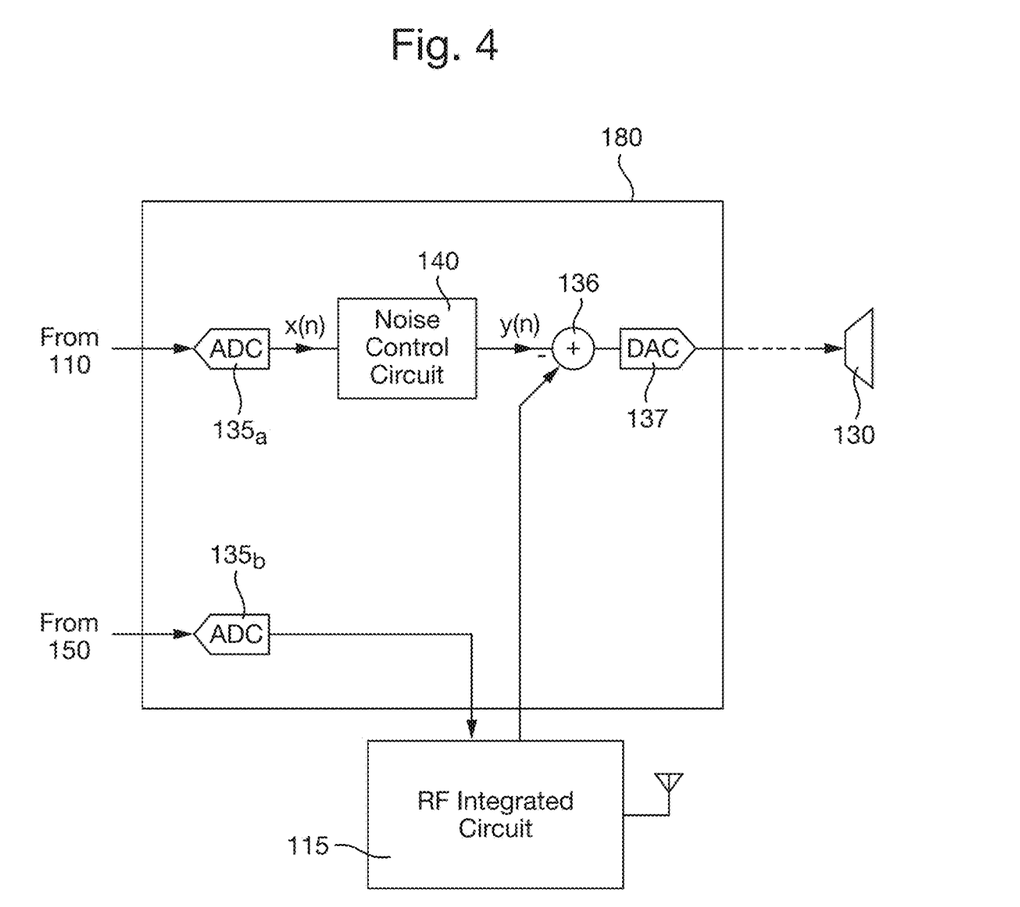
FIG. 4 is a block diagram of the audio integrated circuit provided in the wireless communication device depicted in FIG. 3.

FIG. 4 is a block diagram of the audio integrated circuit 180 provided in the wireless communication device depicted in FIG. 3 and illustrates selected units of the integrated circuit. Specifically, the integrated circuit receives an input signal from reference microphone 110 and includes an analog-to-digital converter (ADC) 135a for generating a digital representation of the input signal x(n) which is passed to a noise control circuit 140 according to an example of the present aspects, wherein the noise control circuit is configured to generate a control signal y(n).

The audio integrated circuit comprises a further ADC 135b for generating a digital representation of the signal generated by the near-speech microphone 150. Combiner 136 may combine audio signals including the noise control signal y(n) (which by convention may have the same polarity as the noise in the reference microphone signal and will therefore be subtracted by the combiner 136), a portion of the near-speech microphone signal to allow a user of the wireless communication device to hear his or her own voice, in addition to downlink speech communication which is received from the radio frequency integrated circuit 115. The digital-to-analogue converter 137 receives the output of the combiner 136, amplifies the output of the DAC (Not shown) and passes the resultant signal to the speaker 130.

From consideration of FIG. 3 it will be appreciated that a feedback path $H_{dm}$ arises between the speaker 130 and the reference microphone 110.

Figure 5:
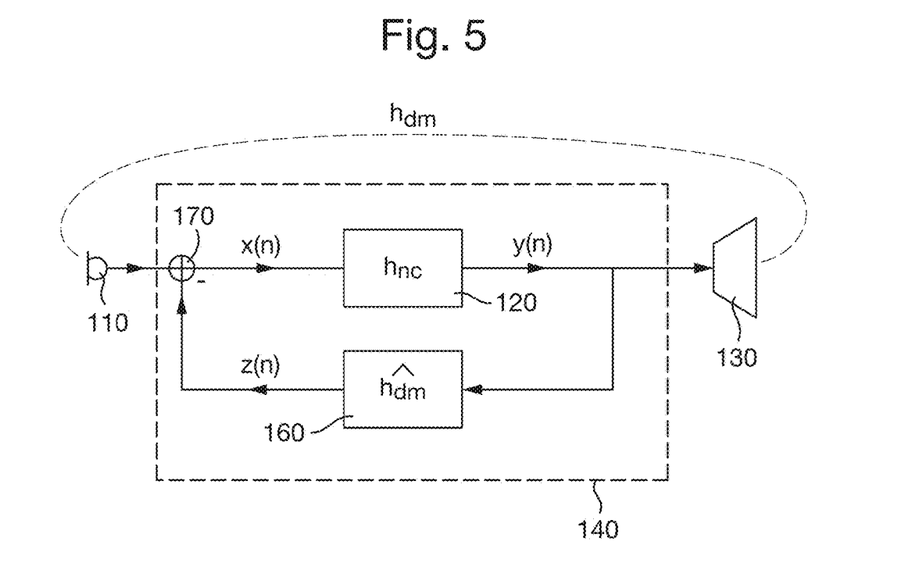
FIG. 5 illustrates an example of a noise control circuit according to the first aspect.

FIG. 5 illustrates an example of a noise control circuit 140 according to the first aspect. The noise control circuit may be implemented within a monolithic integrated circuit such as the CODEC 180 illustrated in FIG. 4, or may be implemented within any other audio processing circuit which incorporates an noise control circuit for controlling or cancelling noise. It will also be appreciated that the noise control circuit may be provided in a variety of different devices, not just within a mobile phone.

The noise control circuit 140 comprises a noise control unit 120 which receives an input signal x(n) generated in part by a reference microphone 110. The input signal represents ambient noise and other sounds detected by the reference microphone. The noise control unit 120 is operable to generate a control signal y(n) based on the input signal. The control signal comprises an anti-noise signal—in other words a signal representing the noise but with inverted phase (antiphase)—that is emitted by a speaker 130 of the device in which the noise control circuit is implemented, in order to cancel or at least control or mitigate the level of the noise that is heard by a user.

The noise control circuit further comprises a feedback control unit 160. The feedback control unit may be considered to be provided in parallel with the feedback path between the speaker 130 and the microphone 110. The feedback control unit is configured to generate a feedback control signal z(n) for controlling a feedback signal $h_{dm}$ comprised in the input signal x(n). The feedback control unit is configured to select a filter candidate from a plurality of predetermined filter candidates, wherein each filter candidate represents a possible feedback path between the speaker and the reference microphone. The plurality of predetermined filter candidates may be considered to form a dictionary, a library or look-up-table (LUT) of filter candidates.

It will be appreciated that the plurality of predetermined filter candidates may be stored in one or more parts associated with the feedback control unit 160 or may be stored in parts provided separate. The filter candidates may have been post-processed to fit in the limited memory space on the device.

In use, the control signal y(n) that is output from the noise control unit 120 is passed through the selected filter candidate in order to generate an estimation of the feedback signal $\widehat{h_{dm}}$. The resulting representation of the feedback signal forms the feedback control signal z(n) and is subtracted from the input signal at combiner 170.

According to at least one example, the dictionary of filter candidates are predetermined during a prior characterisation stage. The characterisation stage may be carried out prior to the intended operation of the noise control functionality of the device e.g. during a manufacturing process and/or line testing of the device.

An advantage of deriving a filter from a plurality of filter candidates that have been predetermined, is that the accuracy of the feedback control is enhanced whilst the processing burden that is placed on the system is alleviated in comparison to e.g. a fully adaptive algorithm which would require a significant level of tuning of filter parameters. Noise control circuits according to the present aspects beneficially provide a simple and accurate scheme for addressing the problem of feedback of anti-noise, or acoustic noise control, between the speaker and the reference microphone which relies upon a stored set of filters that have been obtained during a prior, characterisation stage.

Figure 6:
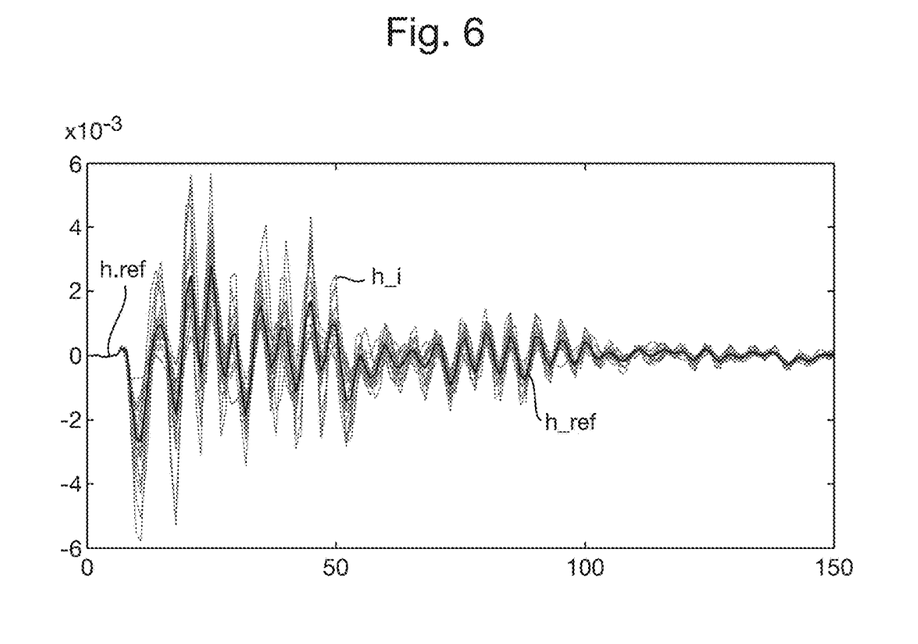
FIG. 6 illustrates a plurality of impulse responses obtained during a characterisation stage.

During a characterisation stage of e.g. a wireless communication device, the handset is positioned against a user's ear in a plurality of different positions and the impulse response of the leakage path between speaker and the reference microphone is determined for each position. These impulse responses, which are illustrated in FIG. 6, can be indicated by h_i where each h_i is an N tap filter and i runs from 1 to M (number of positions of handset against ear). Thus, referring to FIG. 6, each of the thinner lines represents the leakage response at a given position. Some or all of these impulse responses h_i become candidate impulse responses or filter candidates and are stored for subsequent reference by the feedback control unit. The characterisation stage may involve additional processing of the measurements.

Figure 7:
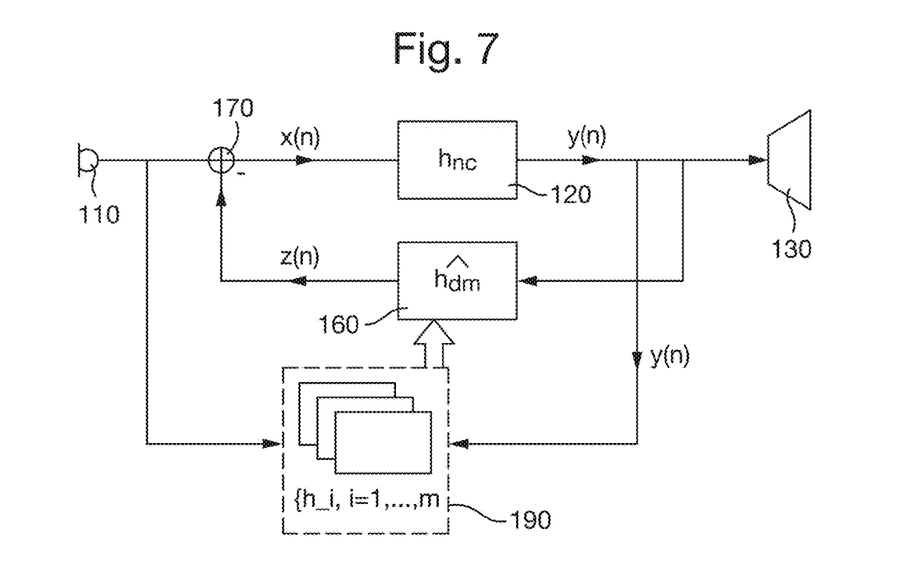
FIG. 7 illustrates a second example of a noise control circuit of the first aspect.

According to a second example illustrated in FIG. 7, a noise control circuit is provided having a number of parts in common with the noise control circuit illustrated in FIG. 5. Additionally, the noise control circuit comprises a filter selection unit 190 which is operable at runtime to select at least one filter candidate from said dictionary to form the filter of the feedback control unit. Thus, during use of the device and in order to mitigate the occurrence of acoustic feedback between the speaker and the reference microphone, the filter selection unit is configured to select the most appropriate filter candidate(s) to form the filter of the feedback control unit 160.

According to the present example, the filter selection unit is configured to select the most appropriate filter candidate(s) based on a determination of the error that would arise in connection with each of the filter candidates if that filter candidate were selected to generate the estimate of the feedback signal $\widehat{h_{dm}}$ and, thus, the feedback control signal z(n).

As illustrated in FIG. 7, the filter selection unit 190 is configured to receive the noise control signal y(n) that is passed to the speaker 130. The filter selection unit 190 is also configured to receive the signal x(n) that is generated by the reference microphone 110. According to one particular example, in order to calculate the error associated with each of the filter candidates, the noise control signal y(n) is passed through all of the available filters h_i. After passing the noise control signal y(n) through the each of the filter candidates, the resulting set of signals are each considered to be a candidate feedback control signal, wherein each candidate feedback control signal is an estimation of the signal $h_{dm}$ that is leaked to the ANC mic. If we call this estimation $\widehat{x(n)}\_\iota$ and compare it to the feedback signal that is captured in the ANC mic, x(n) we can calculate an error for each position i, as:

$$e_i = x(n) - \widehat{x(n)}\_\iota$$

This error—which can also be reformulated to be considered to be a similarity metric—indicates how suitable each of the h_i's is in representing the leakage path. Put another way, the similarity metric indicates the probability that a given filter correctly represents the feedback path. It will be appreciated that other metrics may be derived in order to consider the suitability of each of the filter candidates. The lower the error for the i_th filter, the higher the probability and the more preferable it is that we should use that filter—let it be called h_ref for the leakage compensation filter. Referring to FIG. 6, the h_ref filter shown as the strongest/thickest line.

According to one example, the filter selection unit is configured to select the predetermined filter candidate which results in a feedback control signal having the lowest error, or highest similarity, as the feedback signal that is captured at the ANC mic to be the filter of the feedback control unit.

Alternatively, the filter selection unit is configured to build or derive a filter for the feedback control unit which is based on a weighted combination of a plurality of predetermined filter candidates. This can be understood with reference to FIG. 9 which provides a graphical representation of a feedback signal x(n) that is captured by the ANC mic, together with 3 candidate feedback control signals $\widehat{x(n)}\_\iota$ (where i=1 . . . 3) which are obtained by passing the noise control signal through each of three, previously determined, filter candidates.

Figure 9:
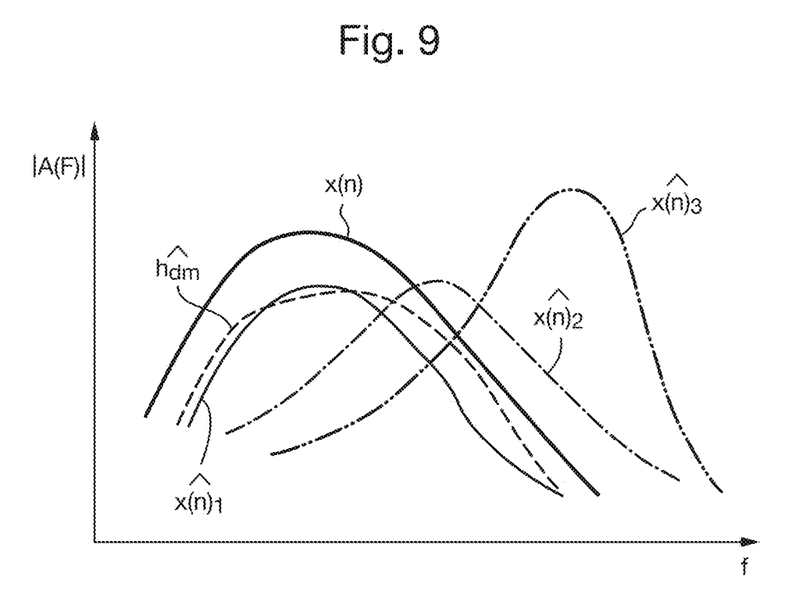
FIG. 9 illustrates the construction of an estimated feedback path based on a weighted combination of candidate filter paths.

The error associated with each of the candidate feedback control signals, and corresponding probability P, is as follows:

$e_1=0.1; P_1=0.9$
$e_2=0.4; P_2=0.29$
$e_3=1.1; P_3=0.01$

Thus, the filter of the feedback control unit may be composed of a weighted sum of the filter candidates:

$$\widehat{h_{dm}} = \Sigma_{i=1}^{3} P_i h_i = 0.9 h_1 + 0.3 h_2 + 0.01 h_3$$

The resultant filter is represented graphically in FIG. 9 by the dotted line. Thus, the present examples benefit from a significant reduction in the complexity of real-time implementation by utilising a set of predetermined filter candidates to derive a model of the feedback path and, thus, reduce or cancel the feedback component. By building a filter from a weighted combination of filter candidates a high accuracy of feedback modelling is beneficially achieved using constrained optimization without the need for a fully adaptive modelling approach.

In practice, according to one or more examples, the dictionary of predetermined filter candidates may comprise only a limited number of impulse responses for the device. In order to account for this discrete sampling of all of the possible positions, according to at least one example the filter selection unit is configured to build the feedback control filter h_ref based on a combination, or linear combination, of a plurality of the dictionary candidates (h_i).

The logic behind this approach relies on the assumption that a device's current position against a user's ear will be between two of the measured positons—i.e. between two of the candidate impulse responses (h_i's). The lesser the error e_i then the higher P_i. Here, P_i is the posterior probability of having filter h_i selected in reconstructing h_ref.

The number of selected candidates for combination is J, where J<<M and, according to a preferred example J=2 which means that only two of the h_i s are used in reconstructing the h_ref. In this sense the present example can be considered to be a spare reconstruction of the feedback path.

Figure 8:
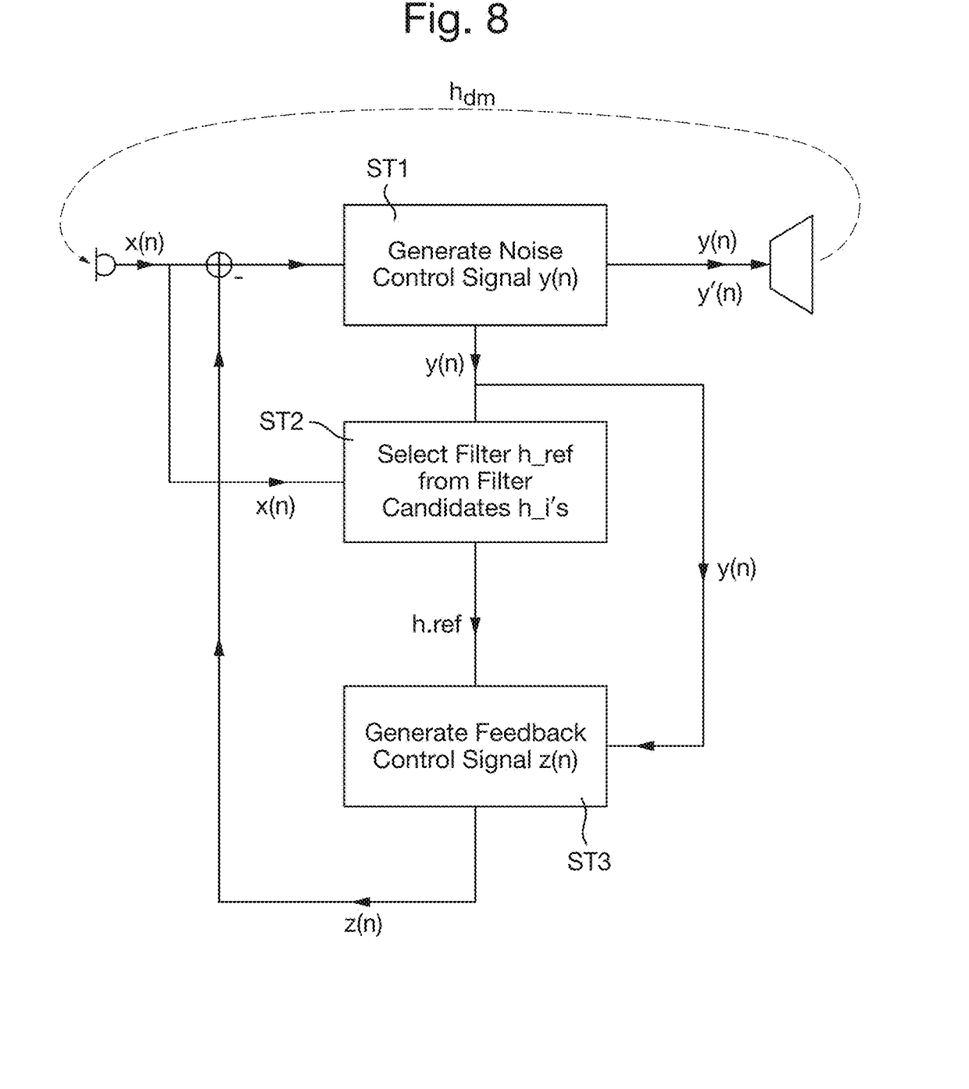
FIG. 8 illustrates a method according to an example of the second aspect.

FIG. 8 is a flow chart to illustrate a method according to an example of the second aspect. In a first stage ST1 a noise control signal y(n) is generated based on an input signal x(n) received from a reference microphone. In a second stage ST2 a filter H_ref is selected from a plurality of predetermined filter candidates H_i (I=1 . . . M) which have been predetermined during a prior characterisation stage (not shown).

According to at least one example the filter is derived (selected or built) by finding, for each of the candidate filters, the difference D between the input signal x(n) and the filtered output of the noise control signal. The difference can be considered to be an error. As discussed above, according to one example the selected filter is the filter candidate with the smallest difference D. According to another example the filter is built based on a plurality of filter candidates, wherein the contribution of the filter candidates may be weighted. For example, the contribution of the filter candidates may be weighted according to a similarity metric that is determined for each of the filter candidates.

In a third stage a feedback control signal is generated. Specifically, the noise control signal is passed through the selected filter in order to obtain the feedback control signal which can be considered to be an estimate of the feedback path. The feedback control signal is subtracted from the input signal. The feedback-controlled noise control signal y'(n) is passed the loudspeaker.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications examples of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the examples may also be implemented using code running on a field-(re)programmable analogue array or similar device in order to configure analogue hardware.

Note that as used herein the term unit or module shall be used to refer to a functional unit or block which may be implemented at least partly by dedicated hardware components such as custom defined circuitry and/or at least partly be implemented by one or more software processors or appropriate code running on a suitable general purpose processor or the like. A unit may itself comprise other units, modules or functional units. A unit may be provided by multiple components or sub-units which need not be co-located and could be provided on different integrated circuits and/or running on different processors.

Examples may be implemented in a host device, especially a portable and/or battery powered host device such as a mobile computing device for example a laptop or tablet computer, a games console, a remote control device, a home automation controller or a domestic appliance including a smart home device a domestic temperature or lighting control system, a toy, a machine such as a robot, an audio player, a video player, or a mobile telephone for example a smartphone.

It should be noted that the above-mentioned examples illustrate rather than limit the invention, and that those skilled in the art will be able to design many alternative examples without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A noise control circuit comprising:
   a noise control unit arranged to receive an input signal which represents a sound detected by a reference microphone, the noise control unit being configured to generate a noise control signal comprising an inverted phase representation of the input signal, wherein the noise control signal is passed to a speaker;
   a feedback control unit comprising a filter, the feedback control unit being configured to receive the noise control signal and to pass the noise control signal through the filter in order to generate a feedback control signal for controlling a feedback signal comprised in the input signal,
   wherein the filter is derived from one or more predetermined filter candidates, each filter candidate representing a possible feedback path between the speaker and the reference microphone.

2. A noise control circuit as claimed in claim 1, wherein the feedback control signal is subtracted from the input signal in a stage prior to the input signal being passed to the noise control unit.

3. A noise control circuit as claimed in claim 1, further comprising:
   a filter selection unit configured to derive said filter from said dictionary of predetermined filter candidates.

4. A noise control circuit as claimed in claim 3, wherein the filter selection unit is operable to derive said filter based on, for each filter candidate, a determination of an error that will arise if that filter candidate is selected to generate the feedback control signal.

5. A noise control circuit as claimed in claim 4, wherein the filter selection unit is configured to receive the noise control signal and to pass the noise control signal through each of the candidate filters to generate a set of candidate feedback control signals.

6. A noise control circuit as claimed in claim 5, wherein the filter selection unit is configured to receive the input signal and to determine a difference between the input signal and each of the candidate feedback control signals in order to calculate the error for each filter candidate.

7. A noise control circuit as claimed in claim 6, wherein the filter selection unit is configured to select the filter candidate for which the lowest error is determined to be the filter for the feedback control unit.

8. A noise control circuit as claimed in claim 1, wherein the filter selection unit is configured to build the filter for the feedback control unit from a weighted combination of a plurality of filter candidates.

9. A noise control circuit as claimed in claim 1, wherein the filter selection unit is operable to derive said filter based on, for each filter candidate, a determination of a similarity metric.

10. A noise control circuit as claimed in claim 1, wherein the speaker generates an anti-noise signal based on the noise control signal in order to cancel or at least reduce the noise that is heard by a user.

11. A noise control circuit as claimed in claim 1, wherein the feedback control unit is provided in parallel with the feedback path between the speaker and the reference microphone.

12. A noise control circuit as claimed in claim 1, wherein the feedback control signal comprises an estimation of the feedback signal.

13. A noise control circuit as claimed in claim 1, in the form of a monolithic integrated circuit.

14. A device comprising a signal processing circuit according to claim 1, wherein the device comprises a mobile telephone, headphone, acoustic noise cancelling headphones, a smart watch, an audio player, a video player, a mobile computing platform, a games device, a remote controller device, a toy, a machine, or a home automation controller, a domestic appliance or other portable device.

15. A feedback control module having a filter for controlling a feedback signal comprised in a noise control signal comprising an inverted phase representation of an input signal, wherein the filter comprises a model or representation of the feedback path and is derived from a weighted sum of candidate feedback paths.

* * * * *

UNITED STATES PATENT AND TRADEMARK OFFICE
CERTIFICATE OF CORRECTION

PATENT NO. : 10,283,106 B1
APPLICATION NO. : 15/938614
DATED : May 7, 2019
INVENTOR(S) : Saeidi et al.

Page 1 of 2

It is certified that error appears in the above-identified patent and that said Letters Patent is hereby corrected as shown below:

In the Drawings

1. In Fig. 4, Sheet 3 of 7, delete Tag "$135_a$" and insert Tag -- 135a --, therefor.

2. In Fig. 4, Sheet 3 of 7, delete Tag "$135_b$" and insert Tag -- l35b --, therefor.

3. In Fig. 7, Sheet 4 of 7, for Tag "190", in Line 1, delete "{h_i, i=1,...,m" and insert -- {h_i, i=1,...,m} --, therefor.

4. In Fig. 6, Sheet 5 of 7, delete "h.ref" and insert -- h_ref --, therefor.

5. In Fig. 8, Sheet 6 of 7, delete "h.ref" and insert -- h_ref --, therefor.

In the Specification

6. In Column 6, Line 9, delete "an noise" and insert -- a noise --, therefor.

7. In Column 7, Line 51, delete "$\overline{x(n)}\_\iota$" and insert -- $\overline{x(n)}\_i$ --, therefor.

8. In Column 7, Line 55, delete "$e_i = x(n) - \overline{x(n)}\_\iota$" and insert -- $e_i = x(n) - \overline{x(n)}\_i$ --, therefor.

Signed and Sealed this
Twenty-second Day of October, 2019

Andrei Iancu
*Director of the United States Patent and Trademark Office*

CERTIFICATE OF CORRECTION (continued)
U.S. Pat. No. 10,283,106 B1

9. In Column 8, Line 13, delete "$\overline{x(n)\_\iota}$" and insert -- $\overline{x(n)\_i}$ --, therefor.

10. In Column 8, Line 52, delete "h_i s" and insert -- h_i's --, therefor.

11. In Column 8, Line 59, delete "H_ref" and insert -- h_ref --, therefor.

12. In Column 8, Line 60, delete "H_i (I=1 . . . M)" and insert -- H_i (I =1 . . . m) --, therefor.